US008639005B2

(12) United States Patent
Simonetti et al.

(10) Patent No.: US 8,639,005 B2
(45) Date of Patent: Jan. 28, 2014

(54) METHOD FOR SHARING DATA BETWEEN DATA SETS WITH DIFFERENTIALLY ENCODED DATA

(75) Inventors: Orlando P. Simonetti, Columbus, OH (US); Yiu-Cho Chung, Columbus, OH (US); Hung-Yu Lin, Columbus, OH (US); Yu Ding, Columbus, OH (US); Jacob A. Bender, Galena, OH (US)

(73) Assignee: The Ohio State University, Columbus, OH (US)

(*) Notice: Subject to any disclaimer, the term of this patent is extended or adjusted under 35 U.S.C. 154(b) by 78 days.

(21) Appl. No.: 13/147,314

(22) PCT Filed: Feb. 1, 2010

(86) PCT No.: PCT/US2010/022748
§ 371 (c)(1),
(2), (4) Date: Oct. 17, 2011

(87) PCT Pub. No.: WO2010/088609
PCT Pub. Date: Aug. 5, 2010

(65) Prior Publication Data
US 2012/0051615 A1 Mar. 1, 2012

Related U.S. Application Data

(60) Provisional application No. 61/148,540, filed on Jan. 30, 2009.

(51) Int. Cl.
*G06K 9/00* (2006.01)
*A61B 5/05* (2006.01)

(52) U.S. Cl.
USPC .................................... 382/131; 600/410

(58) Field of Classification Search
USPC ......... 382/128, 129, 130, 131, 132, 133, 134; 378/4, 8, 21–27, 101, 901; 600/407, 600/410, 411, 425, 427; 128/920, 922
See application file for complete search history.

(56) References Cited

U.S. PATENT DOCUMENTS

| | | | |
|---|---|---|---|
| 5,318,026 A * | 6/1994 | Pelc .............................. | 600/410 |
| 5,435,303 A | 7/1995 | Bernstein et al. | |
| 6,393,313 B1 * | 5/2002 | Foo .............................. | 600/410 |
| 6,483,308 B1 | 11/2002 | Ma et al. | |
| 6,564,081 B1 * | 5/2003 | Frigo et al. ................... | 600/410 |
| 7,283,859 B2 * | 10/2007 | Madore ........................ | 600/410 |
| 2006/0273792 A1 | 12/2006 | Kholmovski et al. | |

* cited by examiner

*Primary Examiner* — Abolfazl Tabatabai
(74) *Attorney, Agent, or Firm* — Meunier Carlin & Curfman, LLC

(57) ABSTRACT

An exemplary embodiment of the present invention includes a method for increasing temporal resolution in Phase Contrast (PC) MR imaging. The increased temporal resolution may be obtained by reusing information encoded into phase of an MRI signal where said reuse occurs prior to the difference reconstruction.

6 Claims, 20 Drawing Sheets

| | one-sided | two-sided non-SVE | two-sided SVE |
|---|---|---|---|
| sampling window length | 1 k-space line | 2 k-space lines | 2 k-space lines |

1-Sided Encoding: EPI with 4 echo trains/k-space

2-Sided Encoding with SVE : EPI with 4 echo trains/k-space

1-Sided Encoding, Sharing ¼ of K-Space
Collecting Consecutive Velocity Encodings 2-Sided Encoding with SVE, Sharing ¼ of K-Space
Collecting Consecutive Lines of K-Space

METHOD FOR SHARING DATA BETWEEN DATA SETS WITH DIFFERENTIALLY ENCODED DATA

CROSS-REFERENCE TO RELATED APPLICATIONS

This application claims priority to U.S. Provisional Patent Application No. 61/148,540 filed on Jan. 30, 2009, which is incorporated herein by reference.

FIELD OF THE INVENTION

The present invention relates to magnetic resonance imaging (MRI). In particular, the present invention relates to a method for image reconstruction that results in improved temporal resolution over those methods known to the art.

BACKGROUND AND SUMMARY OF THE INVENTION

Phase-contrast magnetic resonance imaging (PCMRI) is a method of encoding the velocity of particles traveling along a gradient field into the phase of the magnetic spin.

$$\text{velocity} = v \quad (\text{eq. 1})$$
$$\downarrow$$
$$\phi_{velocity} = \phi_v$$

The velocity is encoded by applying appropriately designed gradient lobes in the velocity encoding direction; bipolar gradient lobes are one example. The two lobes of the bipolar gradient are created so their areas are equal and opposite. This makes the zeroth moment, $m_0$, of the gradient waveform equal to 0 after the bipolar lobes. Since $m_0=0$, no phase is imparted to static spins. Spins moving along the bipolar gradient direction experience a phase shift due to the difference in their positions from the first and second lobes of the bipolar gradient. This phase shift is proportional by the gyromagnetic ratio to the first moment, $m_1$, of the bipolar gradient.

$$\phi_v = v * \gamma * m_1 \quad (\text{eq. 2})$$

Higher order motion such as acceleration, jerk, snap, crackle, and pop can be encoded using the higher order gradient moments $m_2$, $m_3$, $m_4$, $m_5$, and $m_6$ respectively. In practice, the bipolar gradient waveform used for velocity encoding can be overlapped with other waveforms in the pulse sequence such as ramp ups, ramp downs, and refocusing waveforms. This reduces echo times, repetition times, and scan times. Velocity encoding will be used to describe the invention due to its common use in clinical applications, although the invention may be used to improve temporal resolution in any technique that uses multiple encodings to generate a time series of images.

PCMRI sequences used for velocity encoding are designed with the $m_1$ used to encode the velocity into phase. The limitation placed on the velocity encoded phase is that it cannot exceed 360° without experiencing wrapping or aliasing in the image. When aliasing occurs, the same phase angle encodes for two or more velocity values. An aliased pixel value creates ambiguity on the true velocity as shown in FIG. 1.

PC sequences for velocity encoding typically require an aliasing velocity, $V_{ENC}$, to be input by the user. This value is used to set the $m_1$ such that the phase will not wrap and velocities between $-V_{ENC}$ and $+V_{ENC}$ will not be aliased. The range of non-aliased velocities are zero centered, allowing equally for velocities in the positive and negative directions. The range can also be shifted to allow for only positive velocities or only negative velocities or an arbitrary range. For further discussion, the zero centered range with limits $\pm V_{ENC}$ will be used.

$$v \rightarrow \phi_v (-180° \text{ to } +180° \text{ range}) \quad (\text{eq. 3})$$

One of the practical issues that has to be dealt with in PC imaging is an unknown background phase in an image. This background phase comes from a variety of sources (e.g. $B_0$ inhomogeneity, susceptibility differences, etc.) and varies across the image affecting the accuracy of the velocity measurement.

$$\text{background phase from static tissue} = \phi_{static} \quad (\text{eq. 4})$$
$$= \phi_s (360° \text{ range})$$

Because of the background phase on the image, PC requires an additional data separation step that is not required in standard data acquisition. To compensate for $\phi_s$, two complete datasets are acquired with some combination of $\phi_s$ and $\phi_v$ at each pixel. From these data sets $\phi_s$ and $\varnothing_v$ can be separated and an image of phase due to velocity can be reconstructed. Standard data acquisition is as shown in FIG. 2. PC data acquisition requires the additional data separation step shown in FIG. 3.

As shown in FIG. 3, variables $a_{v,1}$ and $a_{v,2}$ represent the weighting of the velocity into the measured phase in the data sets. When playing out the pulse sequence, $a_{v,1}$ and $a_{v,2}$ are set by the $m_1$ of the appropriately designed velocity encoding gradients. These values have to be known so that the data may be separated later. The process can be analogized to the process of encoding a message which is to be sent. An encryption key is used by the sender to take the original message and convert it to the encrypted form. The key is later used by the receiver for decryption to yield the original message.

When each measured data set is reconstructed using the appropriate spatial encoding methods, each pixel of the phase image has phase that comes from three sources; velocity: ($\phi_v$); static background tissue ($\phi_s$); and noise ($\phi_n$).

$$\phi_{noise} = \phi_n \quad (\text{eq. 5})$$

Currently two velocity encoding/decoding methods are commonly used: 1-sided and 2-sided encoding. 1-sided encoding collects two data sets: a velocity encoded, $V_{enc}$, and velocity compensated, $V_0$. The $V_0$ is assumed to be the first data set and the $V_{enc}$ is assumed to be the second data set. The order of the data can be switched. For the $V_0$ data, all of the phase in the measured data comes from the static background tissue and noise. The bipolar gradients are played out so there is no phase due to velocity.

$$\phi_0 = \phi_s + \phi_{n,0} \quad (\text{eq. 6})$$

An important point to note is the assumption that static background phase is assumed to be constant for the acquisition of both of the data sets. Noise varies between the data sets so it is denoted with a subscript on the acquisition in which it comes from.

For 1-sided encoding, the second acquisition is $V_{enc}$ data. For this acquisition the bipolar gradient is played out to so that a $+V_{ENC}$ velocity multiplied by $a_{v,2}$ yields $+180°$ of phase shift and a $-V_{ENC}$ velocity multiplied by $a_{v,2}$ yields $-180°$ of phase shift. The magnitude of $a_{v,2}$ is set to prevent aliasing due to wrapping of the phase.

$$\phi_{enc} = \phi_v + \phi_s + \phi_{n,enc} \quad \text{(eq. 7)}$$

$$a_{v,2} = \frac{180°}{VENC}$$

The mapping of phase to velocity for the encoded and compensated images are shown in FIG. 4.

Data separation is then performed by subtracting the velocity compensated data set from the velocity encoded data set to yield the phase due velocity. This subtraction cancels out the common phase due to static tissue while maintaining the velocity phase which is present in only the $V_{enc}$ data set.

$$\phi_{enc} - \phi_0 = (\phi_v + \phi_s + \phi_{n,enc}) - (\phi_s + \phi_{n,0}) \quad \text{(eq. 8)}$$

$$= \phi_v + \phi_{n,enc} + \phi_{n,0}$$

The data is then reconstructed into an image where pixel intensity is set by the phase which is proportional to velocity. For simplicity, the magnitude of the complex signal has been ignored and only the phase retained. Due to the complex nature of the signal, there are multiple ways to perform the subtraction used for data separation. The phase difference method and complex difference methods are further discussed in the *Handbook of MRI Pulse Sequences* by Matt A. Bernstein, Kevin F. King, and Xiaohong Joe Zhou Elsevier, Academic Press, 2004 which is hereby incorporated by reference.

The other method which has been used is 2-sided encoding. 2-sided encoding is commonly used on General Electric (GE) MRI systems while SIEMENS has typically utilized 1-sided encoding. In 2-sided encoding the two data sets acquired are $V_-$ (data set 1) and $V_+$ (data set 2). Again the order is arbitrarily set, does not represent a required acquisition sequence, and can be changed. For the $V_-$ acquisition the bipolar gradient is played out to so that a $+V_{ENC}$ velocity multiplied by $a_{v,1}$ yields $-90°$ of phase shift and a $-V_{ENC}$ velocity multiplied by $a_{v,1}$ yields $+90°$ of phase shift. The smaller phase sensitivity to velocity used in the $V_-$ (and $V_+$) encoding is to prevent aliasing in the data separation step and is shown later.

$$\phi_- = \frac{-\phi_v}{2} + \phi_s + \phi_{n,-} \quad \text{(eq. 9)}$$

$$a_{v,1} = \frac{-90°}{VENC}$$

The $V_+$ acquisition is played out so the bipolar gradient so that a $+V_{ENC}$ velocity multiplied by $a_{v,2}$ would yield $-90°$ of phase shift and a $-V_{ENC}$ velocity multiplied by $a_{v,2}$ would yield $+90°$ of phase shift.

$$\phi_+ = \frac{+\phi_v}{2} + \phi_2 + \phi_{n,+} \quad \text{(eq. 10)}$$

$$a_{v,1} = \frac{+90°}{VENC}$$

Data separation is then preformed by subtracting the $V_-$ data set from the $V_+$ data set in the same way as 1-sided encoding to yield the phase due velocity.

$$\phi_+ - \phi_- = \left(\frac{+\phi_v}{2} + \phi_s + \phi_{n,+}\right) - \left(\frac{-\phi_v}{2} + \phi_s + \phi_{n,-}\right) \quad \text{(eq. 11)}$$

$$= \phi_v + \phi_{n,+} + \phi_{n,-}$$

The mapping of phase to velocity for the positive and negative images are shown in FIG. 5.

The need for reducing the sensitivity by half from the $V_{enc}$ to the $V_+/V_-$ data sets comes from the subtraction of $\phi_+$ and $\phi_-$. Even though a higher sensitivity wouldn't cause wrapping of the velocity phase in each of the data set, it could cause wrapping in the difference between the images. Therefore the sensitivity for each of the acquisitions in 2-sided has to be half the sensitivity of 1-sided.

Thus, conventional PC-MRI utilizes either a pair of velocity-encoded and velocity-compensated datasets or a pair of equal and opposite polarity velocity-sensitized k-space datasets. In either case, phase-difference or complex-difference reconstruction is performed on each complex data pair to eliminate any residual non-zero phase variation due to effects other than velocity. Conventional PC-MR velocity mapping requires twice as much data as standard MRI scans. This requirement either degrades the temporal sampling rate by a factor of two, or doubles the acquisition time in order to maintain temporal resolution.

Cardiac echo-sharing has been utilized to improve the effective temporal resolution in segmented cine and phase-contrast imaging. In echo-sharing, portions of k-space are shared between adjacent images for both velocity-compensated and velocity-encoded lines. Therefore, partial k-space data is shared and reconstructed from two or more temporally adjacent k-space data pairs. Because image characteristics are dominated by the central portion of k-space, echo-sharing methods require the acquisition of an additional central line or segment of k-space for each pair of reconstructed frames. Otherwise, if the central lines of k-space were shared between frames, those frames would contain substantially the same information.

The present invention of Shared Velocity Encoding (SVE) reconstruction can be used to increase the effective temporal resolution of PC-MRI. In conventional PC-MRI reconstruction, the phase difference is calculated from consecutive pairs of (+ −) velocity encoded k-space lines. Thus, if the total number of acquired k-space lines is N, the resulting number of reconstructed phase-difference lines is N/2. In contrast, the SVE PC-MRI method of the present invention shares data between consecutive images. By doing so, N−1 phase-difference lines from alternate polarity pairs (+ −), (− +), (+ −), etc., can be constructed from the N acquired k-space lines. The result is that the effective temporal resolution is increased by a factor of 2.

SVE reconstruction provides for improved methods of MRI blood flow velocity mapping. Additionally, the very high temporal resolution data acquisition necessary for MRI pulse wave velocity (PWV) measurement—that is not exhibited by the traditional methods of PC-MR imaging—is enabled by SVE reconstruction. Conventional MRI flow quantification methods require the acquisition of additional reference data to account for errors in the signal phase. SVE reconstruction eliminates the temporal resolution penalty associated with the acquisition of this additional reference data. The SVE reconstruction method can be combined with a segmented EPI readout to achieve high temporal resolution real-time velocity mapping by minimizing sensitivities to respiratory and cardiac motions. More benefits and additional applications of SVE reconstruction will become apparent upon review of the figures and detailed description that follows.

DETAILED DESCRIPTION

Figure 14:
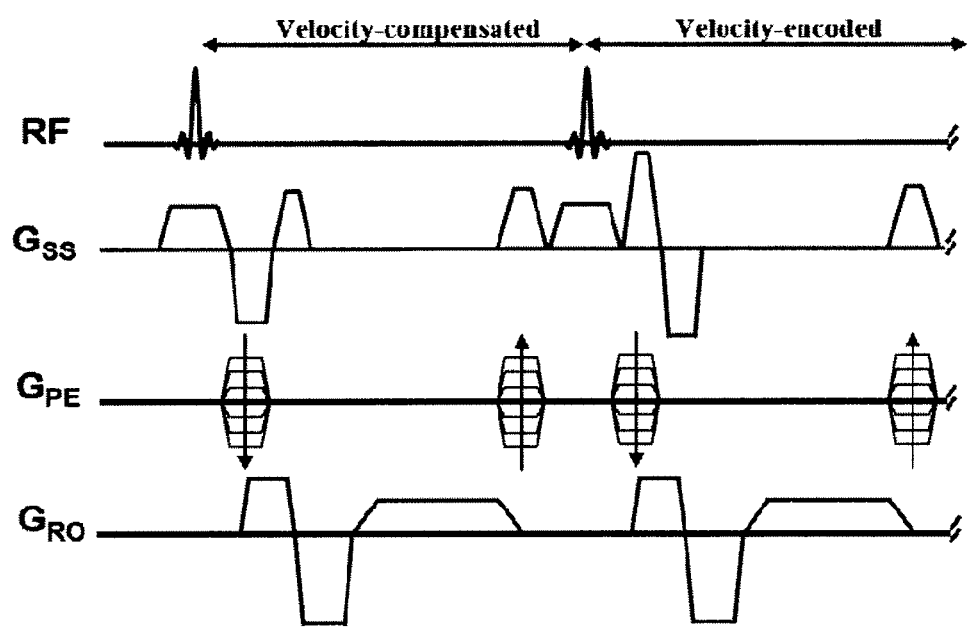
FIG. 14 is a scheme showing spoiled gradient-echo phase contrast pulse sequence for one-directional velocity encoding along the slice-selection direction using a pair of velocity-compensated and velocity encoded gradients.
Figure 15:
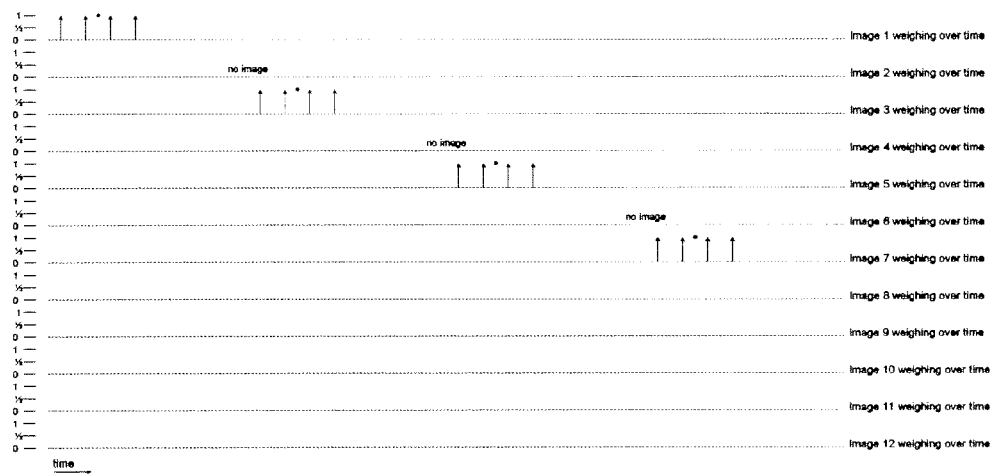
FIG. 15 shows a diagram of 1-Sided Encoding: EPI with 4 echo trains/k-space
Figure 16:
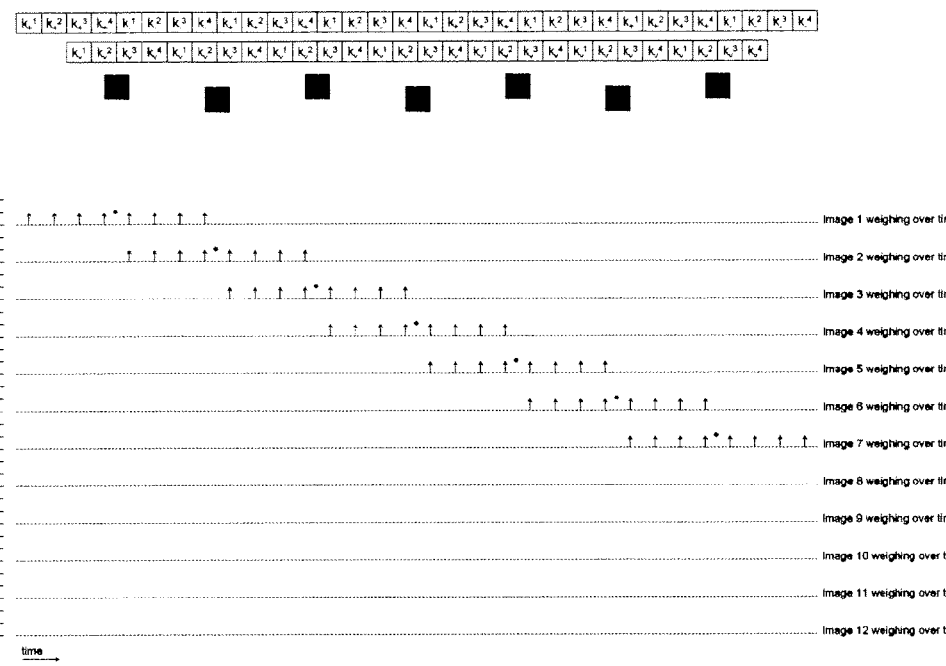
FIG. 16 shows a diagram of 2-Sided Encoding with SVE: EPI with 4 echo trains/k-space
Figure 17:
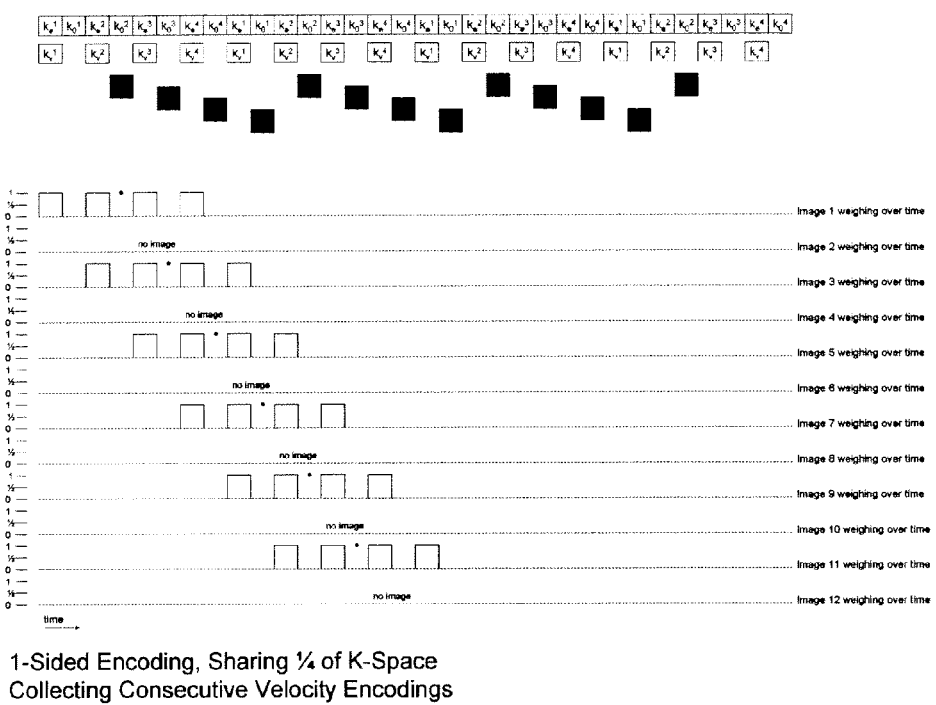
FIG. 17 shows a diagram of 1-Sided Encoding, Sharing ¼ of K-Space (nearest neighbor)
Figure 18:
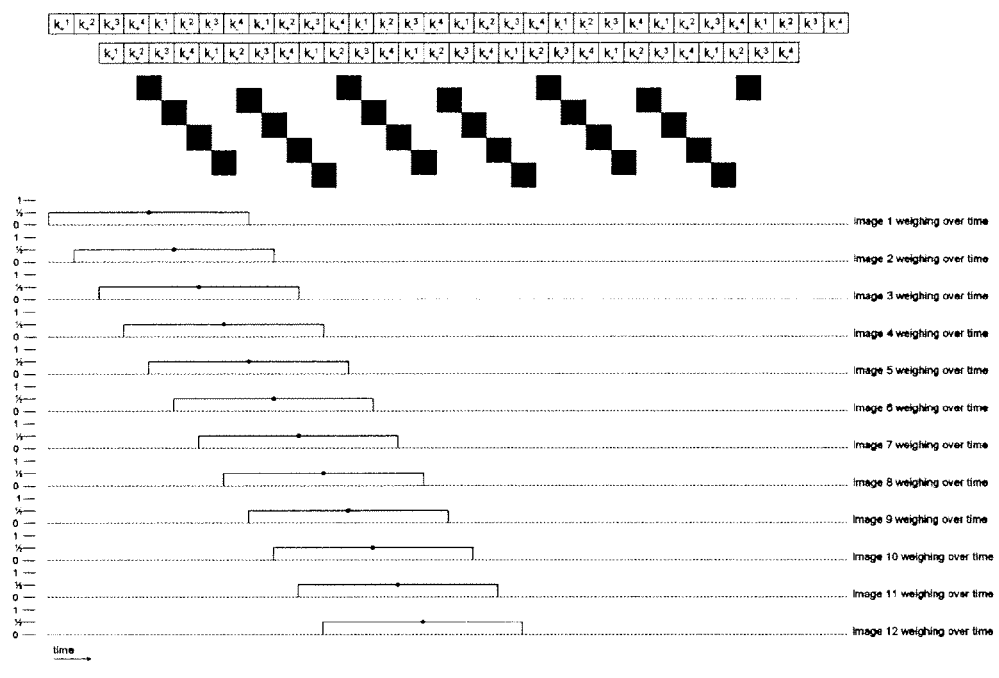
FIG. 18 shows a diagram of 2-Sided Encoding with SVE, Sharing ¼ of K-Space (nearest neighbor)
Figure 19:
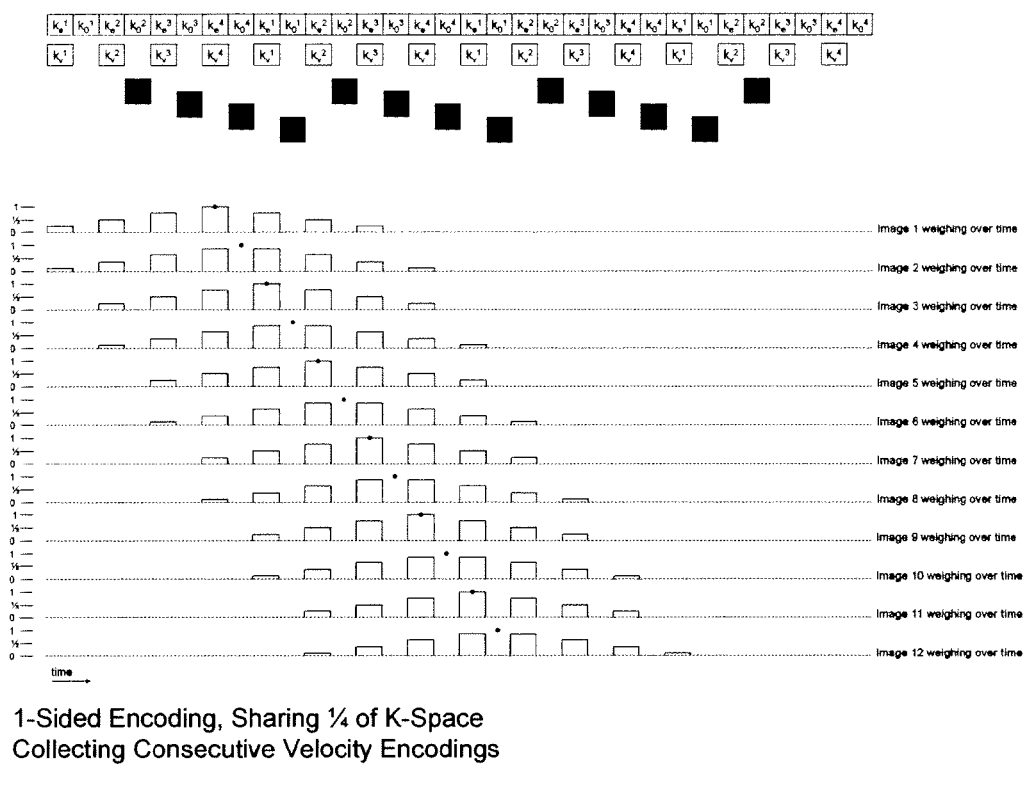
FIG. 19 shows a diagram of 1-Sided Encoding, Sharing ¼ of K-Space (linear interpolation)
Figure 20:
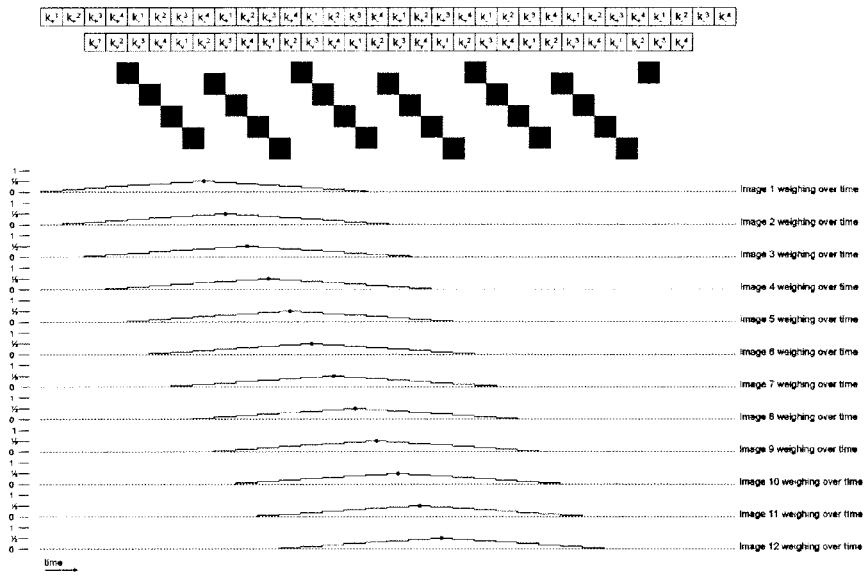
FIG. 20 shows a diagram of 2-Sided Encoding with SVE, Sharing ¼ of K-Space (linear interpolation)
Figure 24:
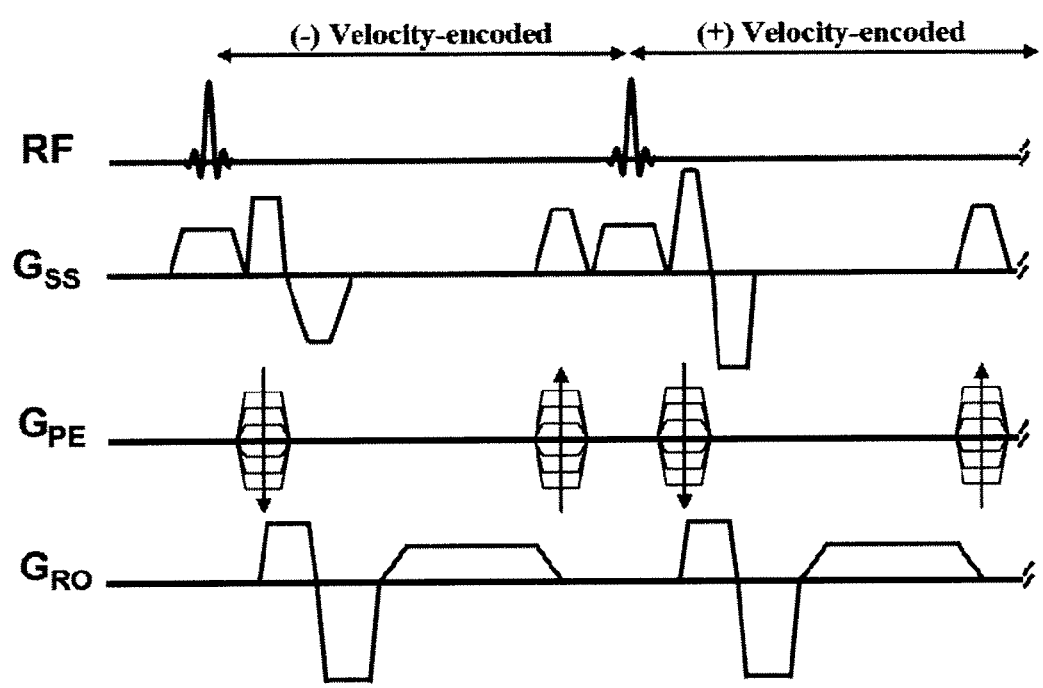
FIG. 24 is a scheme showing spoiled gradient-echo phase-contrast pulse sequence for one-directional velocity encoding along the slice-selection direction using a pair of equal and opposite polarity velocity-sensitized gradients.

Conventional phase-contrast MR images are commonly acquired using a spoiled gradient-echo sequence combined with a pair of velocity-sensitized gradients on one or more gradient axes. There are two basic approaches to achieving quantitative and qualitative velocity measurement by PC-MRI. As shown in FIG. 14, one technique (1-sided) employs a pair of velocity-compensated and velocity-encoded gradients to eliminate background phase variations. As shown in FIG. 24, the other technique (2-sided) employs equal and opposite polarity velocity-sensitized gradients to eliminate background phase variations. Subtraction of two datasets is performed to eliminate residual non-zero phase shifts that stem from undesired phase variation other than motion, such as field inhomogeneity, eddy currents, and magnetic susceptibility. However, the additional acquisition of a phase-reference, which typically interleaves with the velocity-encoding dataset, reduces the temporal resolution as compared to standard cine image scans.

To reduce the effects of background phase variations, and other unwanted contributions to the phase, two consecutive images are acquired. A pixel-by-pixel phase subtraction is performed to determine the difference in phase in these two images. In this manner, quantitative measurement of blood flow can be estimated from the phase difference between two velocity-sensitized datasets. Both conventional PC-MRI approaches require additional phase information that doubles the amount of data required relative to other MRI pulse sequences. As the result, PC-MRI requires either extended scan time or sacrifices in spatial and temporal resolution that make real-time flow quantification and three-dimensional acquisition impractical.

Figure 25:
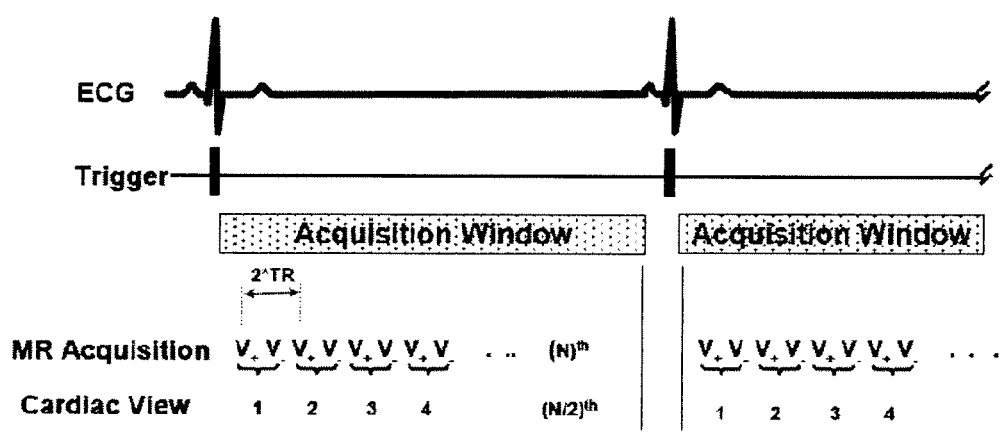
FIG. 25 is a scheme showing conventional non-segmented PC-MRI reconstruction.

SVE is a novel PC-MRI reconstruction technique that improves temporal resolution by reusing adjacent k-space data to reconstruct twice as many frames as conventional PC-MRI reconstruction methods. As previously mentioned, one type of conventional PC-MRI method works by alternating the polarity of velocity encoding gradients from one k-space to the next between positive [+] and negative [−] velocity encoding (i.e., [+ −], [+ −]) as shown in FIG. 25.

Figure 26:
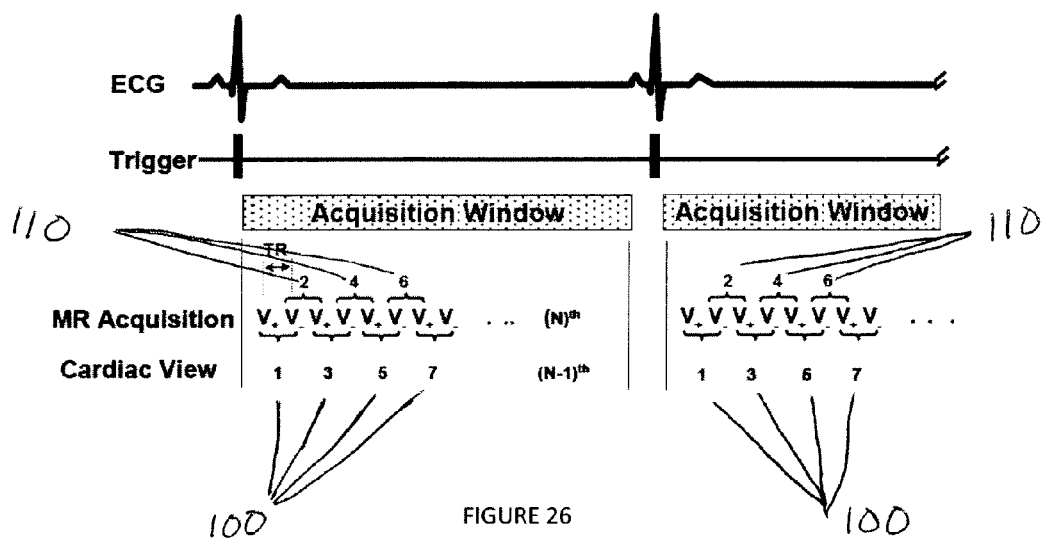
FIG. 26 is a scheme showing non-segmented PC-MRI with bipolar VENC and SVE reconstruction.

The velocity map is obtained by subtracting the negative velocity encoded image from the positive encoded k-space data. The temporal resolution of the velocity map is therefore half the image frame rate. In the conventional PC-MRI method, the phase-contrast images are calculated from consecutive pairs of [+ −] velocity encoded lines. This results in N/2 reconstructed temporal-phase images from N acquired full k-space datasets as shown in FIG. 25. In SVE, data are acquired in the same way, but the velocity map is reconstructed by sliding the pair of images for subtraction one frame at a time (instead of two), resulting in a factor of 2 improvement in effective temporal resolution as is shown in FIG. 26. Using SVE, velocity-sensitized data is reconstructed between consecutive images with alternate polarity velocity encoding. As a result, N−1 phase-difference lines from alternate polarity pairs (i.e. [+ −], [− +], [+ −]), etc., can be reconstructed from N acquired lines, resulting in nearly a factor of 2 increase in effective temporal resolution. As shown in FIG. 26, the odd numbered reconstructed phases 100 are equivalent to conventional phase-different reconstruction while the additional intermediate even-numbered phases 110 are generated by SVE reconstruction.

Due to the need for two data sets to determine the phase due to velocity and background phase, the temporal resolution of PC-MRI sequences is half that of imaging methods that require just one data set. For 1-sided encoding, the typical data acquisition and image reconstruction is shown in FIG. 6 with k's representing complete k-spaces.

Figure 1:
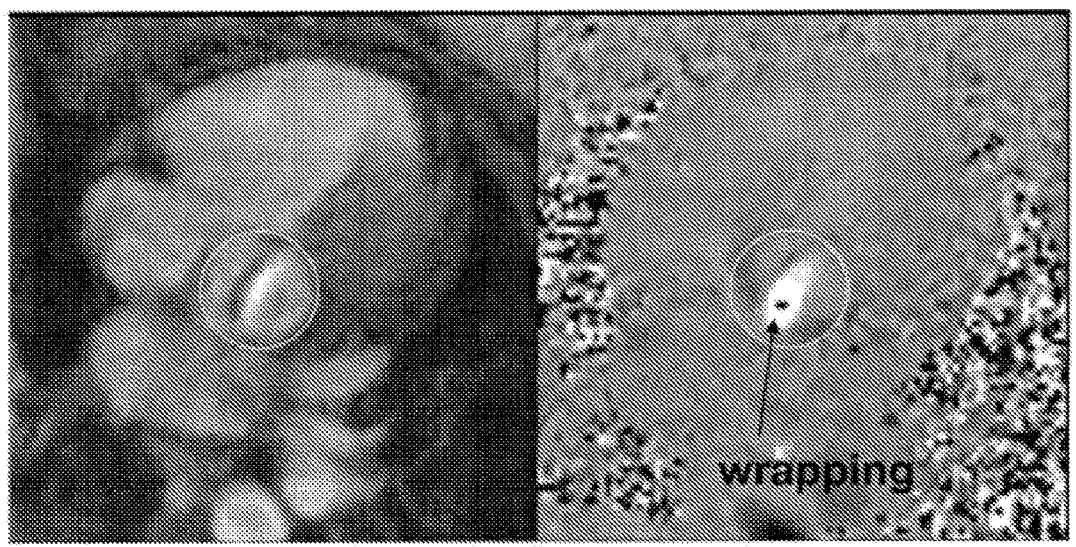
FIG. 1 shows a magnitude (anatomical) image (left) and a phase difference (velocity) image (right) of a bicuspid aortic valve (highlighted with yellow circle). The two black dots are wrapped velocities which have exceeded the $V_{enc}$
Figure 2:
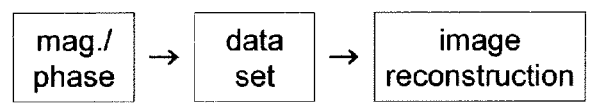
FIG. 2 is a diagram showing how a MRI with traditional magnitude reconstructed image is produced.
Figure 3:
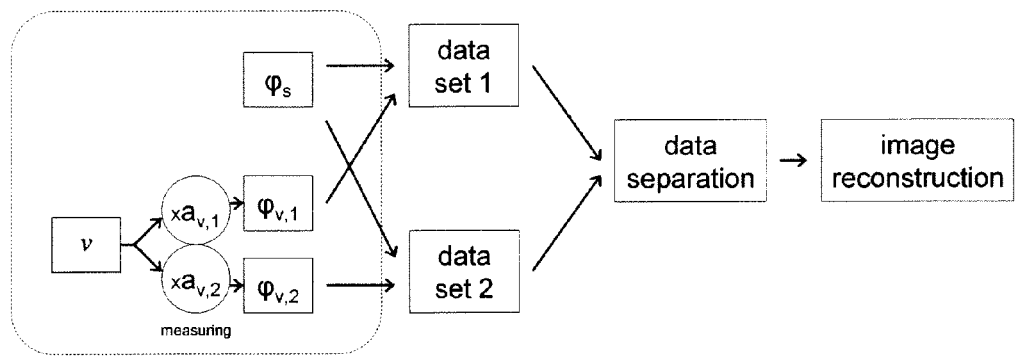
FIG. 3 is a diagram showing how a MR phase contrast reconstructed image is produced.
Figure 4:
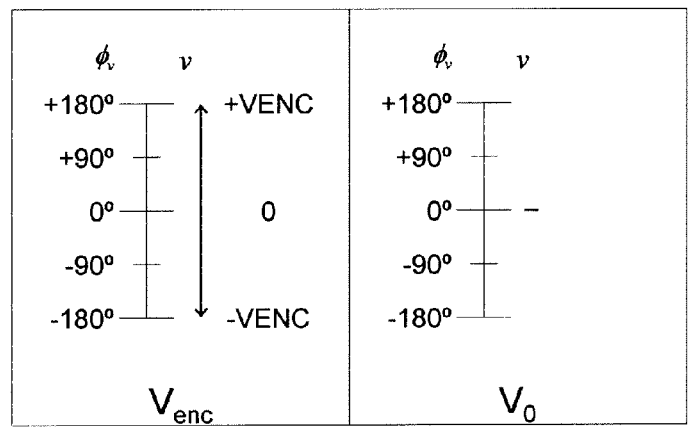
FIG. 4 is a diagram showing the relationship between velocity and phase ranges for $V_{enc}$ and $V_0$.
Figure 5:
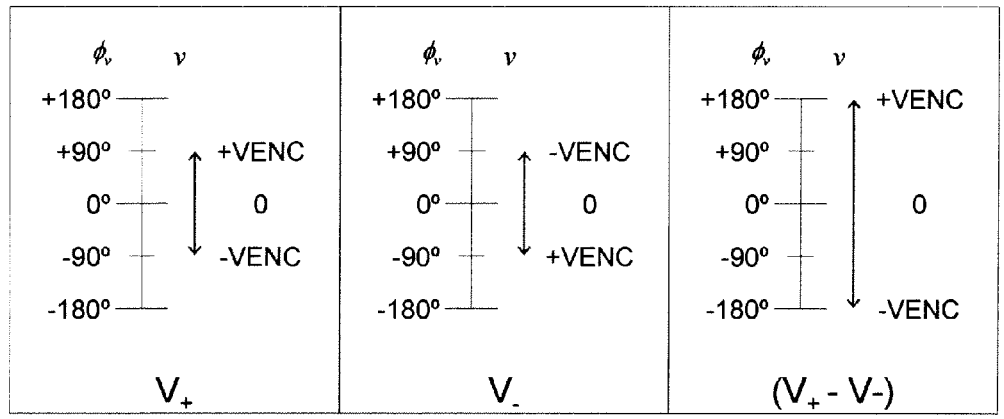
FIG. 5 is a diagram showing the relationship between velocity and phase ranges for $V_+$, $V_-$, and their difference.
Figure 6:
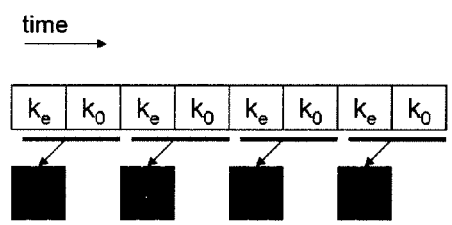
FIG. 6 is a diagram showing 1-sided image reconstruction from k-space data.

As shown in FIG. 6, the first image is reconstructed from the $1^{st} k_e$ and $1^{st} k_0$. The second image is reconstructed from the $2^{nd} k_e$ and $2^{nd} k_c$ and so on. Notice that the images are centered with the center of $k_e$ which are used in the reconstruction verses being centered between $k_e$ and $k_0$. This is because the velocity information completely from the $k_e$ data set and the $k_0$ provides information about the background phase but not velocity which is represented in the reconstructed phase image.

Figure 7:
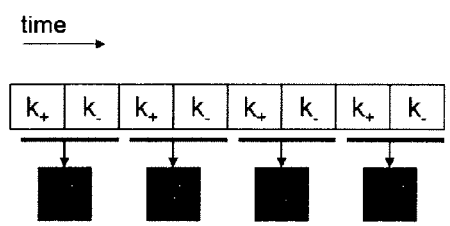
FIG. 7 is a diagram showing 2-sided image reconstruction from k-space data.

2-sided acquisitions are typically reconstructed as shown in FIG. 7. The first image is reconstructed from the $1^{st} k_+$ and $1^{st} k_-$. The second image is reconstructed from the $2^{nd} k_+$ and $2^{nd} k_-$ and so on. Notice that the images are centered between $k_+$ and $k_-$ which are used in the reconstruction. This is because half the velocity information comes from $k_+$ and half from $k_-$.

Figure 8:
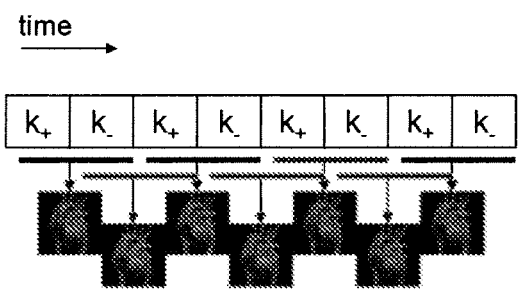
FIG. 8 is a diagram showing shared velocity encoding (SVE) image reconstruction from k-space data.

Shared velocity encoding (SVE) method reconstructs images which share positive and negative encodings that are measured from 2-sided encoding. Additional images are reconstructed between the $2^{nd} k_+$ and $1^{st} k_-$, $3^{rd} k_+$ and 2nd $k_-$, and so on as shown in FIG. 8. This novel method restores temporal resolution which is typically lost with standard PC. Two data sets are always needed for the data separation step: one which uniquely identifies the background phase and one which identifies the phase due to velocity. Previously known PC methods have ignored the two data sets after the data is separated. As SVE travels through time separating the data, it is able to recycle the later data set in its next separation. By recycling this data set, SVE is able to boost its temporal resolution to two times that of standard PC methods.

In SVE, data are acquired in the same way, but the velocity map is reconstructed by sliding the pair of images for subtraction one frame at a time (instead of two). Using SVE, velocity-sensitized data is reconstructed between consecutive images with alternate polarity velocity encoding. As a result, N−1 phase-difference lines from alternate polarity pairs (i.e. [+ −], [− +], [+ −]), etc., can be reconstructed from N acquired lines.

Figure 9:
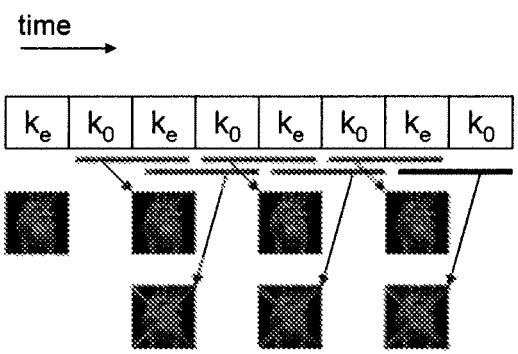
FIG. 9 is a diagram showing 1-sided shared velocity encoding where reused $k_e$ images are redundant since they contain no new velocity information.

Under the assumption that the background phase is constant or slowly changing, recycling can be used with 2-sided encoding but not with 1-sided encoding. With 2-sided encoding, $k_+$ and $k_-$ data sets can be reused because both of the data sets contain velocity information encoded into their phases. As shown in FIG. 9, recycling cannot be used in 1-side encoding because the $k_e$ data set contains all of the velocity information. If $k_e$ data sets were shared across two $k_0$ data sets, the two resulting images would be nearly identical because the velocity information would be identical. Only temporal changes in the background phase would be accounted for.

Although a two-fold improvement in temporal resolution seems advantageous, thorough investigation of SVE has been performed to ensure other performance characteristics are not being detrimentally affected. Three methods were examined: 1-sided encoding, 2-sided encoding without SVE, and 2-sided encoding with SVE. Evaluation focused on constant velocity assumption. One application of PC is to the measurement of blood velocity in vessels. Velocity of blood follows the pulsitile nature of a beating heart. This variation violates the constant velocity assumption in PC introducing an error. The error caused by the changing velocity with the three different methods was investigated.

Figure 10:
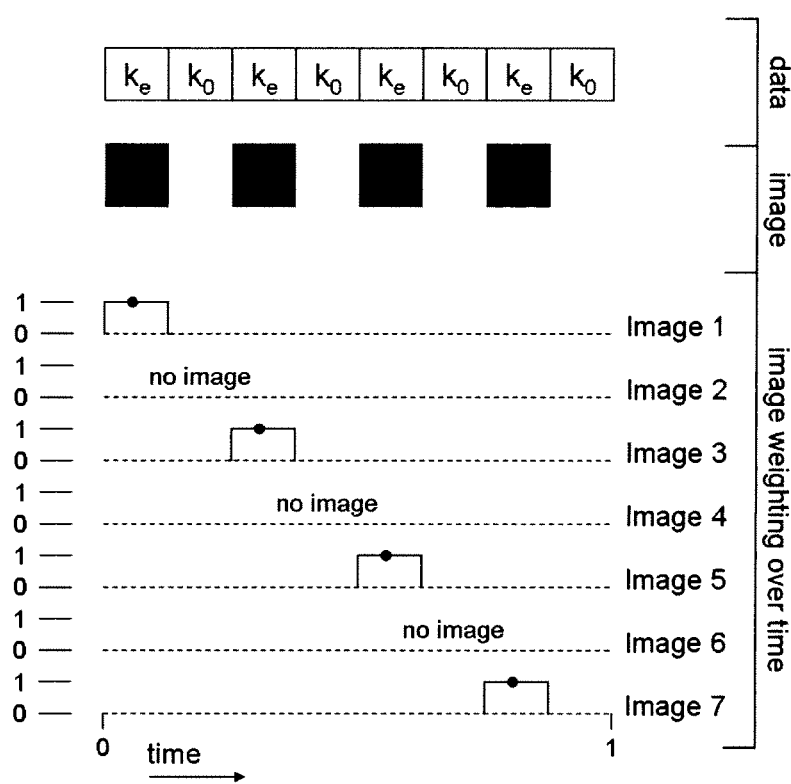
FIG. 10 is a diagram showing 1-sided encoding: image weighting over time.

To start, an understanding is gained of the origin of velocity data in time for images in 1-sided, non-SVE, and SVE. The image weighting over time for 1-sided encoding is shown in FIG. 10.

Figure 11:
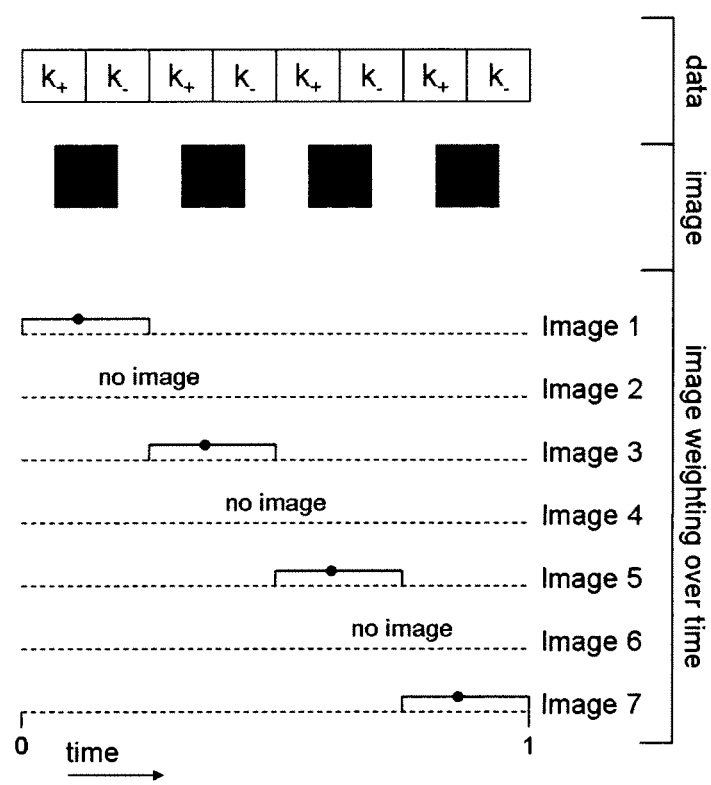
FIG. 11 is a diagram showing 2-sided encoding without SVE: image weighting over time.

An important characteristic which can be seen from this graphic is the image sampling window length. The window length is the amount of time over which the velocity information is acquired. Time is defined in the amount needed to collect one k-space data set. The analysis is kept general by making it independent of factors such as gradient performance, $T^*_2$ decay (EPI limit on train length), and segmentation which affect the amount of time it takes to acquire k-space data sets. Time is normalized to the k-space acquisition time. For 1-side the window length is 1 k-space. The image weighting over time for 2-sided encoding without SVE is shown in FIG. 11.

Figures 12, 13:
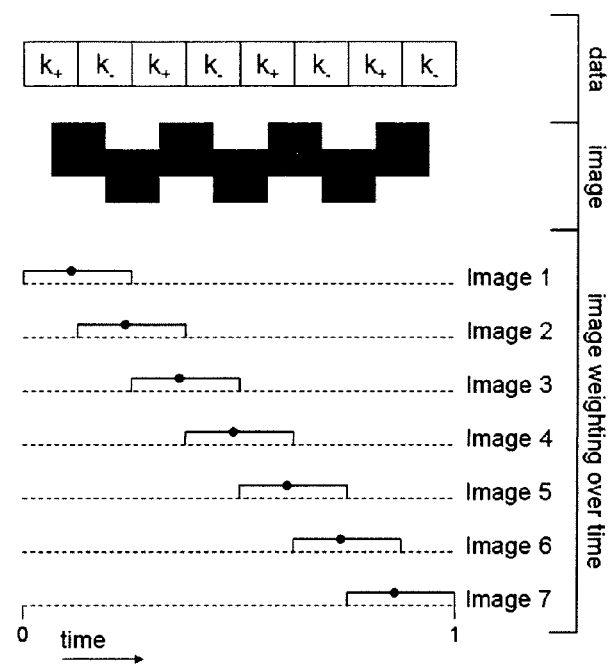
FIG. 12 is a diagram showing 2-sided encoding with SVE: image weighting over time.
FIG. 13 shows a table summary of window length in units of k-space.

For the 2-sided encoding without SVE, the graphic reveals the window length is 2 k-space, twice as much as 1-sided. A longer window length is undesirable. The sampling window has an averaging effect over time. For a constant velocity this does not have any effect, but with a varying velocity the window smoothes the velocity curve by acting as a low pass filter. This smoothes rapidly changing features in the velocity curve such as peaks and valleys. To see if 2-sided encoding with SVE has this same characteristic, the image weighting over time is illustrated in FIG. 12.

Like non-SVE, SVE has the longer 2 k-space window length. The improved temporal resolution can be seen also, but this improvement does not come without drawbacks. Further investigation has to be performed to evaluate the effects of sample window length and temporal resolution on accuracy of 1-sided encoding, 2-sided encoding without SVE, and 2-sided encoding with SVE as can be seen in FIG. 13.

SVE does not alter true temporal resolution because it requires the same acquisition period to collect k-space data for each temporal cine-frame; two temporal cine-frames are used to calculate each velocity map. Both temporal cine-frames contribute equally to the velocity measurement at each time point. When velocity compensated data is used as the phase reference, only the velocity-encoded frames contribute to the measured velocity.

SVE is able to reuse the information from each of its k-space data sets because they both contain velocity information. 1-side encoding is not able to reuse its data since the velocity compensated data set contains no information about velocity. This reuse of data utilized by SVE is somewhat similar to view sharing yet there are critical differences between the two methods. The definition used for view sharing is a reconstruction method that reuses portions of the k-space data in order to reconstruct two or more different images, as set forth by Bernstein in his 2004 book "Handbook of MRI Pulse Sequences".

Figure 27:
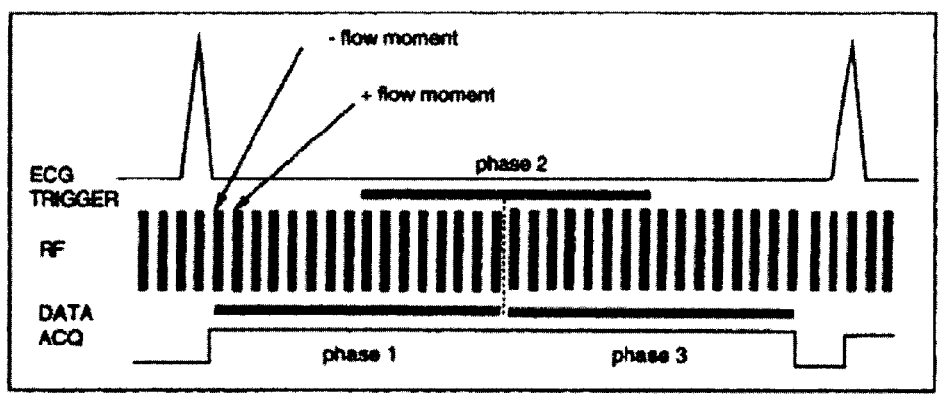
FIG. 27 is a diagram showing the cardiac view-sharing PC-MRI method.
Figure 28:
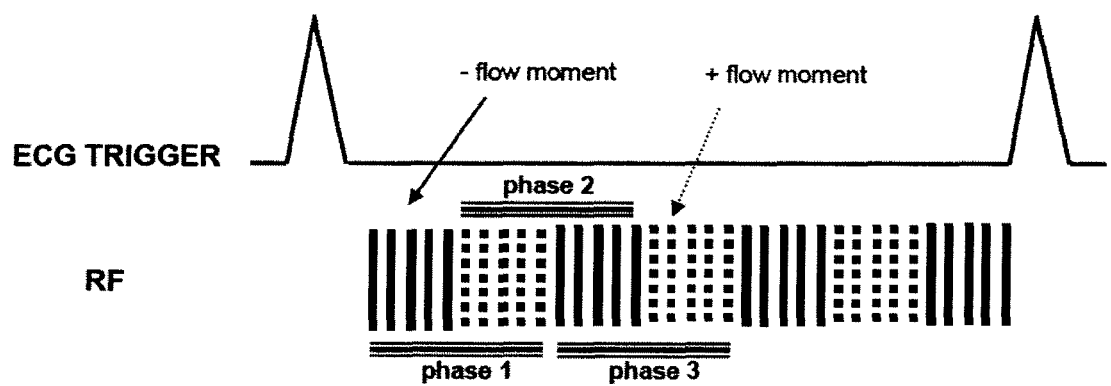
FIG. 28 is a diagram showing the cardiac shared velocity encoding PC-MRI method.

K-space echo-sharing or view-sharing has been utilized as a means of improving the effective temporal resolution in segmented cine and phase-contrast imaging. Unlike echo-sharing, SVE collects a full k-space of data with a given velocity sensitivity followed by another k-space with an opposite velocity sensitivity while the echo-sharing method shares portions of k-space between adjacent images for both the velocity compensated and velocity encoded lines. Therefore, in the echo-sharing method, partial k-space data is shared and reconstructed from two or more temporally adjacent k-space data pairs, as shown in FIG. 27. SVE, on the other hand, does not share parts of k-space with adjacent phases, but instead shares half of the data (V+ or V−) needed for PC-MRI reconstruction as shown in FIG. 28. There are several important differences between SVE and echo-sharing that influence velocity measurements and the applicability of each technique due to difference in the ordering of k-space.

Image characteristics are dominated by the central portion of k-space, echo-sharing methods require the acquisition of an additional central line or segment of k-space for each pair of reconstructed frames. Otherwise, if the central line(s) of k-space were shared between frames, those frames would contain substantially the same information. SVE does not require the acquisition of additional central lines; each frame has a unique combination of central line encodings (V+ and V−), and thus unique velocity information. In segmented acquisitions the smaller the number of segments the less efficient echo-sharing methods are due to the requirement of acquiring additional center lines. In the extreme case of one line per segment, or non-segmented acquisition, echo-sharing fails to provide any gain in temporal resolution while SVE can be successfully applied. As the number of segments increases, the efficiency of echo-sharing increases also, to the extreme of real-time imaging where typically only a single central line of k-space must be acquired uniquely for each image. However, in the particular implementation of real-time PC-MRI using a segmented echo-planar readout, echo-sharing would require the acquisition of an additional echo-train per encoded image, i.e., one for the V+ encoding and one for the V− encoding. This would result in a significant loss in efficiency when compared with SVE which requires no additional data or echo trains to ensure that each reconstructed frame has unique central k-space information.

The data which is being collected has two pieces of information, the velocity and the background signal. The complete process involves data acquisition, separation (i.e. phase difference reconstruction), and image reconstruction (including Fourier Transform, view sharing, etc.).

In some embodiments, SVE is not a substitute for other techniques used in velocity encoding but rather can be used in conjunction with one or more of the known techniques. In these embodiments, SVE may be used with other performance enhancing techniques to further extend the performance of an SVE sequence. For example, the SVE method can be combined with echo-sharing for additional gains in temporal resolution. SVE may be used with one or a combination of the following:

- Gradient echo
- Spin echo
- EPI: echo planar imaging
- View Sharing (including but not limited to retrogating, prospective gating, interpolation, nearest neighbor interpolation, linear interpolation, image space interpolation,
- k-space space interpolation, sliding window)
- RF pulses (including but not limited to spatial selective 1/2/3D, spectral pulse, adiabatic)
- Correction gradients
- Physiological gating, triggering, and monitoring
- Parallel Imaging
- Multiple receive coil or transmit coils
- Tagging
- Data acquisition (including but not limited to spiral, radial, propeller)
- Inversion recovery (single or multiple)
- Phase difference reconstruction
- Complex difference reconstruction
- Any difference reconstruction algorithm This table provides only some of the possible techniques compatible with SVE and does not represent a comprehensive list.

To show some of the compatible techniques, EPI and view sharing methods (nearest neighbor and linear interpolation) are shown with 1-side encoding and SVE in FIGS. 15 through 20.

The shared-encoding strategy of SVE is also not limited to velocity encoding. The phase can also be used to encode other information. The novel technique could also be used to encode acceleration, jerk, or higher order motion. It can also be used to encode cyclical motion. Any piece of information which can be encoded into phase differentially between two data sets can utilize the reuse of one of the data set to increase temporal resolution without increasing the sample window length.

Sharing of data can also be done over more than two data sets. If information is encoded differently in more than two data, then information in each data set can be reused. For example, if three data sets contained information encoded in a different manner for each data set, then the first combination could be 1-2-3 followed by 2-3-1 (where data set 1 is acquire after dataset 3), and then 3-2-1. Data set could also be a single point, 1 dimensional, 2 dimensional, or generally any dimension or configuration.

Figure 21:
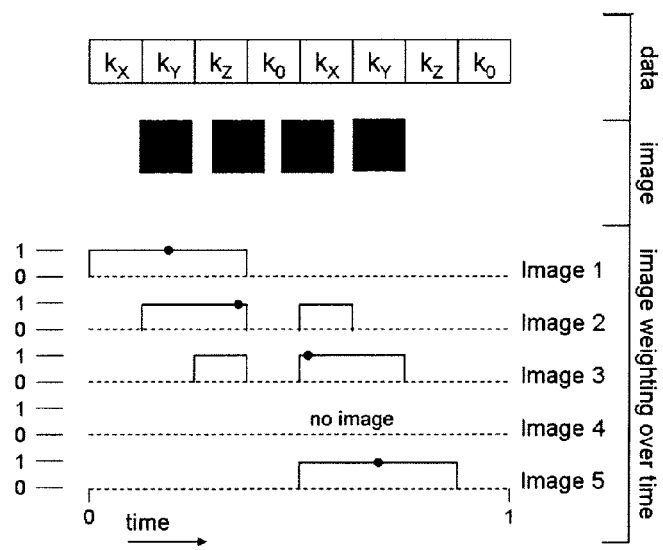
FIG. 21 shows a diagram of 3D velocity encoding with 1-sided.
Figure 22:
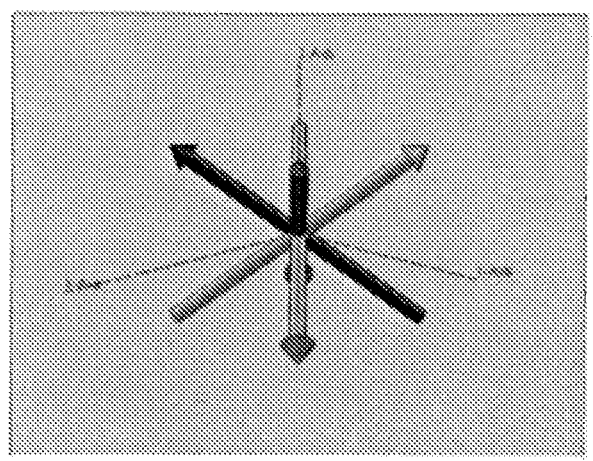
FIG. 22 is a diagram showing equally spaced velocity encoding direction for 2-sided encoding.

An example of a more than two encodings is 3D velocity encoding. This is where velocity is encoded in the x, y, and z directions. As an example of 1-sided encoding, x direction velocity could be encoded in $k_X$, y direction velocity in encoding $k_Y$, z direction velocity in encoding $k_Z$, and a velocity compensated in encoding $k_0$. Three more images could be reconstructed each time an additional set of each encoding is collected (FIG. 21). As an example of 2-sided encoding with 3D velocity encoding, four equally spaced encoding directions are established as shown by FIG. 22.

Figure 23:
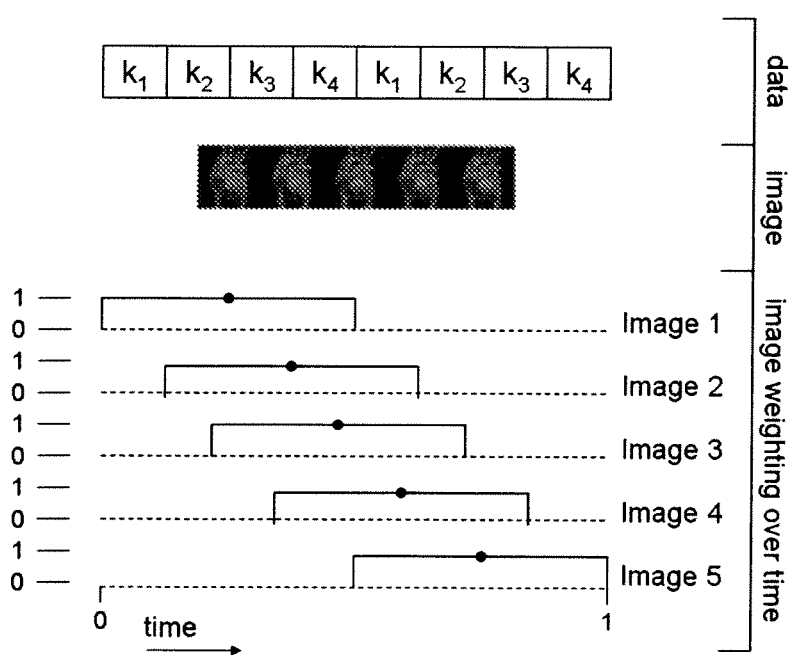
FIG. 23 is a diagram showing 3D velocity encoding with SVE.

Data is encoded into the four directions $k_1$, $k_2$, $k_3$, and $k_4$. Four more images could be reconstructed each time an additional set of each encoding is collected as shown by FIG. 23.

One novel feature of the sharing technique of the present invention, is the ability to update a single encoding instead of having to update both of the encodings. PC-MRI requires data with two different velocity encodings. The phase due to velocity in each encoding is different which allows for separation of the phase due to velocity from the background phase. The novelty of SVE is the ability to share data by updating data from only one of the two encodings instead of having to update both encodings. This allows for better temporal resolution. 1-sided encoding cannot take advantage of this updating strategy because the velocity compensated image contains no velocity information. 2-side velocity encoding can take advantage of this strategy but it has not been realized until now.

This advantage to update encoding more rapidly can be expanded to more than two encodings such as 3D encoding. In 3D encoding, 1-sided velocity encoding can even take advantage of the sharing to a degree. For 1-sided 3D encoding, sharing can allow for the update of $k_X$, $k_Y$, and $k_Z$ only but it cannot allow the update of only $k_0$ because this encoding contains no information of velocity. In 3D encoding, 2-sided velocity encoding also takes advantage of the sharing to a degree. For 2-sided 3D encoding, sharing can allow for the update of $k_1$, $k_2$, $k_3$, and $k_4$ only. Although these improvements do not allow for true temporal resolution to be improved by 3 times for 1-sided and 4 times for 2-sided, some improvement in performance exists.

This sharing technique is also not limited to velocity information or information encoded into the phase of the image; the technique generally applies to any method of dynamic or multi-frame imaging that utilizes two or more encodings. It can be used in any method utilizing multiple encodings of information and acquiring multiple time frames. Magnitude is also use to differentially encode data. Sharing encoding could improve temporal resolution. Sharing could improve BOLD imaging. BOLD imaging utilizes differences in the magnitude of the signal which depend on the blood oxygen concentration. Some of these methods which could be improved with the novel sharing technique are but not limited to:

---

Displacement encoding (DENSE)
Velocity encoding
Acceleration encoding
Higher order motion encoding
Cyclical motion encoding
Diffusion tensor
BOLD
T1 encoding
T2 encoding
T2* encoding
Arterial spin tagging
Phase sensitive inversion recovery
Phase contrast angiography
Dixon method
Resonance separation (general form of Dixon method)

---

While certain embodiments of the present invention are described in detail above, the scope of the invention is not to be considered limited by such disclosure, and modifications are possible without departing from the spirit of the invention as evidenced by the following claims:

The invention claimed is:

1. A method for MRI image reconstruction comprising:
   (a) acquiring a plurality of data sets comprising information encoded differentially into phase that shares data prior to separation, one of said plurality of data sets comprising information that identifies a phase due to velocity;
   (b) performing separation on said plurality of data sets;
   (c) reconstructing an image using said plurality of data sets after separation; and
   (d) recycling the one of said plurality of data sets in a next separation.

2. The method of claim 1 where the information encoded differentially into phase is selected from the group consisting of displacement information, velocity information, acceleration information, or higher order motion information.

3. The method of claim 1 where the information encoded differentially into phase shares is cyclical motion.

4. A method for MRI image reconstruction comprising:
   (a) acquiring a plurality of data sets comprising information encoded differentially into phase;
   (b) reconstructing an image using said plurality of data sets using alternate polarity velocity encoding such that N−1 phase difference lines can be reconstructed from N acquired lines; and
   (c) updating at least a fraction of one of said encodings during reconstruction of said image.

5. The method of claim 4 where the information encoded differentially into phase shares is selected from the group consisting of displacement information, velocity information, acceleration information, or higher order motion information.

6. The method of claim 4 where the information encoded differentially into phase shares is cyclical motion.

* * * * *

UNITED STATES PATENT AND TRADEMARK OFFICE
CERTIFICATE OF CORRECTION

PATENT NO. : 8,639,005 B2  Page 1 of 1
APPLICATION NO. : 13/147314
DATED : January 28, 2014
INVENTOR(S) : Simonetti et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 155 days.

Signed and Sealed this
Twenty-second Day of September, 2015

Michelle K. Lee
*Director of the United States Patent and Trademark Office*